United States Patent
Sukharev et al.

[11] Patent Number: 6,114,259
[45] Date of Patent: Sep. 5, 2000

[54] PROCESS FOR TREATING EXPOSED SURFACES OF A LOW DIELECTRIC CONSTANT CARBON DOPED SILICON OXIDE DIELECTRIC MATERIAL TO PROTECT THE MATERIAL FROM DAMAGE

[75] Inventors: Valeriy Sukharev, Cupertino; Warren Uesato, San Jose; John Rongxiang Hu; Wei-Jen Hsia, both of Sunnyvale; Linggian Qian, San Jose, all of Calif.

[73] Assignee: LSI Logic Corporation, Milpitas, Calif.

[21] Appl. No.: 09/362,645

[22] Filed: Jul. 27, 1999

[51] Int. Cl.$^7$ .................................................. H01L 21/302
[52] U.S. Cl. .......................... 438/789; 438/623; 438/637; 438/639; 438/675; 438/676
[58] Field of Search .................... 438/623, 637, 438/639, 675, 676, 789

[56] References Cited

U.S. PATENT DOCUMENTS

| | | | |
|---|---|---|---|
| 3,012,861 | 12/1961 | Ling | 23/223.5 |
| 3,178,392 | 4/1965 | Kriner | 260/46.5 |
| 3,832,202 | 8/1974 | Ritchie | 106/287 |
| 3,920,865 | 11/1975 | Läufer et al. | 427/220 |
| 4,705,725 | 11/1987 | Glajch et al. | 428/405 |
| 5,194,333 | 3/1993 | Ohnaka et al. | 428/405 |
| 5,858,879 | 1/1999 | Chao et al. | 438/725 |
| 5,874,745 | 2/1999 | Kuo | 257/59 |
| 5,882,489 | 3/1999 | Bersin et al. | 204/192.35 |
| 5,904,154 | 5/1999 | Chien et al. | 134/1.2 |

OTHER PUBLICATIONS

Bothra, S., et al., "Integration of 0.25 βm Three and Five Level Interconnect System for High Performance ASIC", *1997 Proceedings Fourteenth International VMIC Conference*, Santa Clara, CA, Jun. 10–12, 1997, pp. 43–48.

Furusawa, Takeshi, et al., "Reliability of Low–Parasitic–Capacitance Multilevel Interconnection Using Surface–Densified Low–$\epsilon$ Organic Spin–on Glass", *Extended Abstracts of the 1996 International Conference on Solid State Devices and Materials*, Yokhama, 1996, pp. 145–147.

McClatchie, S., et al., "Low Dielectric Constant Oxide Films Deposited Using CVD Techniques", *1998 Proceedings Fourth International DUMIC Conference*, Santa Clara, CA, Feb. 16–17, 1998, pp. 311–318.

Peters, Laura, "Pursuing the Perfect Low–k Dielectric", *Semiconductor International*, Sep., 1998, vol. 21, No. 10, pp. 64–66, 68, 70, 72, and 74.

*Primary Examiner*—Charles Bowers
*Assistant Examiner*—Lisa Kilday

[57] ABSTRACT

A method for treating exposed surfaces of a low k carbon doped silicon oxide dielectric material in order to protect the low k carbon doped silicon oxide dielectric material from damage during removal of photoresist mask materials is described. The process comprises (a) first treating the exposed surfaces of a low k carbon doped silicon oxide dielectric material with a plasma capable of forming a densified layer on and adjacent the exposed surfaces of low k carbon doped silicon oxide dielectric material and (b) then treating the semiconductor wafer with a mild oxidizing agent capable of removing photoresist materials from the semiconductor wafer. These steps will prevent the degradation of the exposed surfaces of a low k carbon doped silicon oxide dielectric material during removal of an etch mask after formation of vias or contact openings in the low k carbon doped silicon oxide dielectric material.

24 Claims, 3 Drawing Sheets

REACTING A CARBON-SUBSTITUTED SILANE WITH A MILD OXIDIZING AGENT TO FORM A LAYER OF A LOW k DIELECTRIC MATERIAL COMPRISING SILICON ATOMS BONDED TO OXYGEN ATOMS AND ORGANIC GROUPS ON A SEMICONDUCTOR STRUCTURE

FIRST TREATING EXPOSED SURFACES OF THE LOW k CARBON DOPED SILICON OXIDE DIELECTRIC MATERIAL WITH A PLASMA COMPRISING NITROGEN GENERATED IN AN ICP PLASMA GENERATOR AND CAPABLE OF FORMING A DENSIFIED PROTECTIVE LAYER ON AND ADJACENT THE EXPOSED SURFACES OF THE LOW k CARBON DOPED SILICON OXIDE DIELECTRIC MATERIAL

THEN SUBJECTING THE SEMICONDUCTOR STRUCTURE TO A MILD OXIDATION TO REMOVE PHOTORESIST MATERIALS WITHOUT DAMAGING THE EXPOSED SURFACES OF THE LOW k CARBON DOPED SILICON OXIDE DIELECTRIC MATERIAL

PROCESS FOR TREATING EXPOSED SURFACES OF A LOW DIELECTRIC CONSTANT CARBON DOPED SILICON OXIDE DIELECTRIC MATERIAL TO PROTECT THE MATERIAL FROM DAMAGE

BACKGROUND OF THE INVENTION

1. Field of the Invention

This invention relates to integrated circuit structures. More particularly, this invention relates to the processing of exposed surfaces of a low dielectric constant carbon doped silicon oxide dielectric material in a manner which will protect the low dielectric constant carbon doped silicon oxide dielectric material from damage.

2. Description of the Related Art

In the construction of integrated circuit structures, dielectric materials such as silicon oxide ($SiO_2$) have been conventionally used to electrically separate and isolate or insulate conductive elements of the integrated circuit structure from one another. However, as the spacing between such conductive elements in the integrated circuit structure have become smaller and smaller, the capacitance between such conductive elements through the silicon oxide dielectric has become of increasing concern. Such capacitance has a negative influence on the overall performance of the integrated circuit structure in a number of ways, including its effect on speed of the circuitry and cross-coupling (crosstalk) between adjacent conductive elements.

Because of this ever increasing problem of capacitance between adjacent conductive elements separated by silicon oxide insulation, as the scale of integrated circuit structures continues to reduce, the use of other insulation materials having lower dielectric constants (k values) than conventional silicon oxide ($SiO_2$) has been proposed. One such class of material is a carbon doped silicon oxide material wherein at least a portion of the oxygen atoms bonded to the silicon atoms are replaced by one or more organic groups such as, for example, an alkyl group such as a methyl ($CH_3$—) group. Such low k carbon doped silicon oxide dielectric materials have dielectric constants varying from about 2.5 to about 3.5 and are, therefore, of great interest as low dielectric constant substitutes for the conventional silicon oxide ($SiO_2$) insulation material.

The substitution of one or more organic groups for some of the oxygen atoms bonded to the silicon atoms in a silicon oxide dielectric material has a beneficial effect in the lowering of the dielectric constant of the carbon doped silicon oxide material, therefore lowering the capacitance between conductive elements separated by such dielectric material. However, it has been found that the bond formed between the silicon atoms and the organic groups is not as stable as the silicon-oxygen bond found in conventional silicon oxide ($SiO_2$) materials.

In particular, for example, unprotected surfaces of such a low k carbon doped silicon oxide dielectric material may be exposed to oxidizing or "ashing" systems, which are used to remove a photoresist mask from the layer of low k carbon doped silicon oxide dielectric material, after formation of openings, such as vias, therein. It has been found that the ashing process results in damage to the bonds (cleavage) between the organic groups and the silicon atoms adjacent the surfaces of the layer of low k carbon doped silicon oxide dielectric material exposed to such an ashing treatment. This cleavage of the carbon-silicon bonds, in turn, results in removal of such organic materials formerly bonded to the silicon atoms along with the organic photoresist materials being removed from the integrated circuit structure. The silicon atoms from which the organic groups have been cleaved, and which are left in the damaged surface of low k carbon doped silicon oxide dielectric material, are in a highly reactive state and become water absorption sites if and when the damaged surface is exposed to moisture. The damaged low k carbon doped silicon oxide dielectric material, and its resultant susceptibility to moisture may be illustrated by the following equations:

This absorption of moisture by the damaged low k carbon doped silicon oxide dielectric material, results in hydroxyl bonding to the reactive silicon atoms left from the cleavage of the carbon-silicon bonds in the damaged surfaces of the low k carbon doped silicon oxide dielectric material. This silicon-hydroxyl bond is not a stable bond, and subsequent exposure to heat, e.g., during subsequent processing such as annealing, can result in cleavage of the silicon-hydroxyl bond, thereby causing water vapor formation which, for example, can interfere with subsequent filling of a via/contact opening or a damacene trench with metal filler material.

The upper surface of the low k carbon doped silicon oxide dielectric material can be protected from such attack during removal of the resist mask by provision of a protective layer, e.g. silicon oxide over the upper surface. However, damage caused by ashing and the use of solvent additionally causes physical damage to any carbon doped silicon oxide material which is exposed in walls of vias or contact openings, resulting in cracked, degraded, bowed, and porous insulating material in the walls of vias or contact openings. The pores in the walls of vias or contact openings can present further problems by retaining solvent within pore cavities as well as retaining, in pore cavities, destructive gases produced during one or more subsequent metal deposition steps. The physical damage to the insulating material which forms the walls of vias or contact openings cause the subsequent metal deposition step to be unreliable; and the presence, in the pore cavities, of gases produced during metal deposition steps result in a degradation of the metal/metal nitride properties.

In copending U.S. patent application Ser. No. 09/281,514 entitled "PROCESS FOR TREATING DAMAGED SURFACES OF LOW DIELECTRIC CONSTANT ORGANO SILICON OXIDE INSULATION MATERIAL TO INHIBIT MOISTURE ABSORPTION", filed Mar. 29, 1999 and assigned to the assignee of this application, it is proposed to treat such damaged sidewalls with either a hydrogen plasma or a nitrogen plasma. Such a treatment with a hydrogen or nitrogen plasma causes the hydrogen or nitrogen to bond to silicon atoms with dangling bonds left in the damaged surface of the low dielectric constant organo silicon oxide insulation layer to replace organo material severed from such silicon atoms at the damaged surface. Absorption of moisture in the damaged surface of the low dielectric constant organo silicon oxide insulation layer, by bonding of such silicon with moisture, is thereby inhibited.

However, it would be desirable to provide a method for processing a low k carbon doped silicon oxide dielectric material, located on an integrated circuit structure, in a manner which will protect surfaces of the low k carbon doped silicon oxide dielectric material exposed by formation of one or more vias therein from being damaged during removal of the etch mask.

SUMMARY OF THE INVENTION

In accordance with the invention, a process is provided for treating exposed surfaces of a low k carbon doped silicon oxide dielectric material, on a semiconductor wafer, in order to protect the low k carbon doped silicon oxide dielectric material from damage during removal of an etch mask. The process of the invention comprises (a) treating the exposed surfaces of a low k carbon doped silicon oxide dielectric material with a plasma capable of forming a densified layer on and adjacent the exposed surfaces of low k carbon doped silicon oxide dielectric material and (b) then treating the semiconductor wafer with a mild oxidizing agent capable of removing photoresist materials from the semiconductor wafer. These steps will prevent the degradation of the exposed surfaces of a low k carbon doped silicon oxide dielectric material during removal of an etch mask after formation of vias or contact openings in the low k carbon doped silicon oxide dielectric material.

DETAILED DESCRIPTION OF THE INVENTION

The invention comprises a process for treating exposed surfaces of a low k carbon doped silicon oxide dielectric material on a semiconductor wafer in order to protect exposed surfaces of the low k carbon doped silicon oxide dielectric material from damage during removal of an etch mask. This process comprises a first step of exposing a silicon substrate to a plasma capable of forming a densified layer on and adjacent the exposed surfaces of the low k carbon doped silicon oxide dielectric material, the densified layer having a thickness sufficient to prevent the degradation of the low k carbon doped silicon oxide dielectric material during the following mild oxidizing step. The second step of the invention is a mild oxidizing step, wherein the semiconductor wafer is exposed to a mild oxidizing agent capable of removing photoresist materials from the semiconductor wafer without degrading the exposed surfaces of the low k carbon doped silicon oxide dielectric material. These two steps thus protect the low k carbon doped silicon oxide dielectric material from damage during removal of an etch mask.

Figure 1:
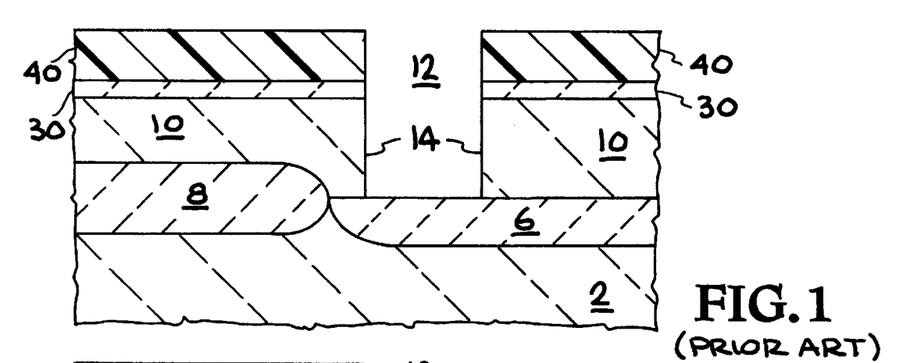
FIG. 1 is a fragmentary vertical cross-sectional view of a prior art integrated circuit structure having a layer of low k carbon doped silicon oxide dielectric material formed over a semiconductor substrate and a contact opening etched in the insulation layer through a resist mask formed over a protective capping layer formed on the upper surface of a layer of the low k carbon doped silicon oxide dielectric material.

Referring now to FIG. 1, a semiconductor substrate is shown at 2 having a layer of low k carbon doped silicon oxide dielectric material 10 formed thereon over field oxide portion 8 and a doped substrate region 6 such as a source/drain region. An opening 12 is etched in layer 10 through a resist mask 40 formed over a protective capping layer 30 on layer 10. Layer 10 of low k carbon doped silicon oxide dielectric material comprises a modified silicon oxide ($SiO_2$) insulation layer which may be formed using a carbon-substituted silane. Opening 12, in the illustrated embodiment, comprises a contact opening (or alternatively, a via) which will be subsequently filled with an electrically conductive material. Such an opening will provide an electrical connection between a metal line (not shown), which will be subsequently formed over insulation layer 10 and capping layer 30, and a portion of an integrated circuit device, such as source/drain region 6, forming a contact opening (or alternatively, providing a connection with an underlying metal line, forming a via). The formation of opening 12 in insulation layer 10 results in exposure of sidewall surfaces 14 comprising an etched portion of the layer of low k carbon doped silicon oxide dielectric material 10.

It should be noted that the term "opening" as used herein, refers to a physical opening (usually vertical) formed in the low k carbon doped silicon oxide dielectric material which will subsequently be filled with a conductive metal in order to conductively connect an underlying active device to an overlying metal interconnect layer (contact opening) or to conductively connect a metal interconnect layer to another metal interconnect layer (via). It should further be noted that vias and contact openings both represent openings in the low k carbon doped silicon oxide material, the exposed surfaces of which may be treated in accordance with the invention, and therefore will be considered equivalent for the purposes of this description.

Figure 2:
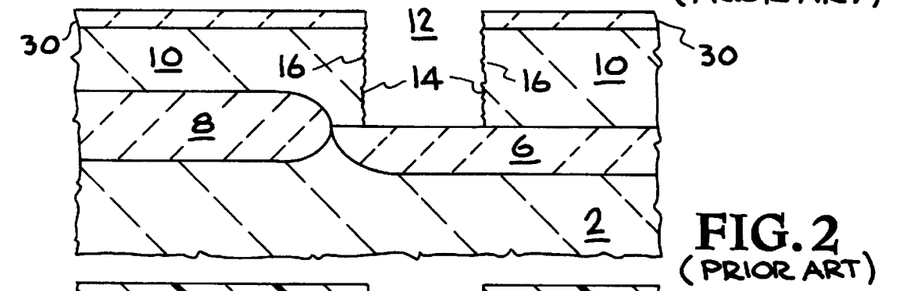
FIG. 2 is a fragmentary vertical cross-sectional view of the prior art structure of FIG. 1 with the resist mask removed, illustrating damage to the exposed sidewall surfaces of the contact opening in the low k carbon doped silicon oxide dielectric material caused by the photoresist ash step.

The prior art structure of FIG. 2 shows the structure of FIG. 1 after subjecting the structure to a harsh oxidation or ashing process to remove resist mask 40, without provision of the protective method of the invention. As seen in FIG. 2, exposed sidewalls 14 of opening 12 in layer of low k carbon doped silicon oxide dielectric material 10 have damaged portions 16 on and adjacent the exposed surfaces of sidewalls 14 resulting from the harsh oxidation of these exposed surfaces of opening 12 in layer 10 upon removal of resist mask 40.

Figure 3:
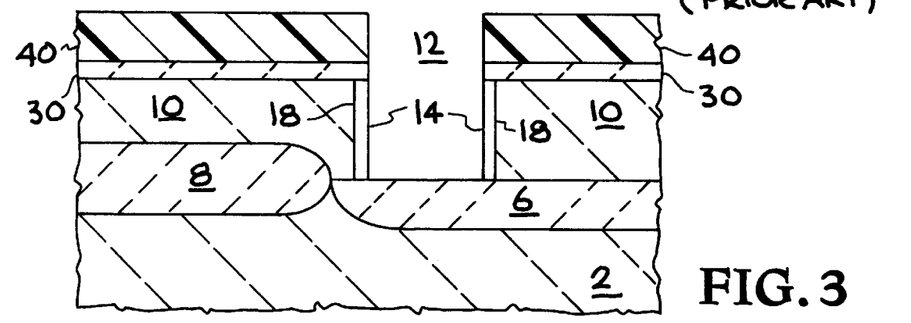
FIG. 3 is a fragmentary vertical cross-sectional view of the prior art structure of FIG. 1 after treatment with a plasma in accordance with the invention, illustrating the densified layer formed on and adjacent sidewall surfaces of the contact opening in the low k carbon doped silicon oxide dielectric material after treatment with a plasma in accordance with the invention.

Referring now to FIG. 3, in accordance with the invention, prior to the step of oxidizing or ashing, sidewalls 14 of opening 12 in low k carbon doped silicon oxide dielectric material layer 10 are treated, in the first step of the process of the invention, with a plasma to form a densified layer 18 in the sidewalls 14 of opening 12 in layer 10. This densified layer will comprise silicon and atoms from the plasma with which the exposed surfaces of the low k carbon doped silicon oxide dielectric material were treated (e.g., if the exposed surfaces of the low k carbon doped silicon oxide dielectric material are treated with a nitrogen plasma, densified layer 18 will comprise silicon and nitrogen). The thickness of densified layer 18 (i.e., the horizontal dimension of densified layer 18 in FIGS. 3 and 4) will be sufficient to protect the low k carbon doped silicon oxide dielectric material from degradation in the following mild oxidation step of the invention. The exposed surfaces of the low k carbon doped silicon oxide dielectric material are thereby protected from damage, while not modifying the dielectric constant of the low k carbon doped silicon oxide dielectric material in such a way as to significantly change the overall capacitance, and particularly the lateral capacitance, between adjacent conductive elements. Typically, the thickness of densified layer 18 will range from about 5 nm to about 50 nm, preferably from about 20 nm to about 50 nm, and most preferably from about 30 nm to about 40 nm.

Figure 4:
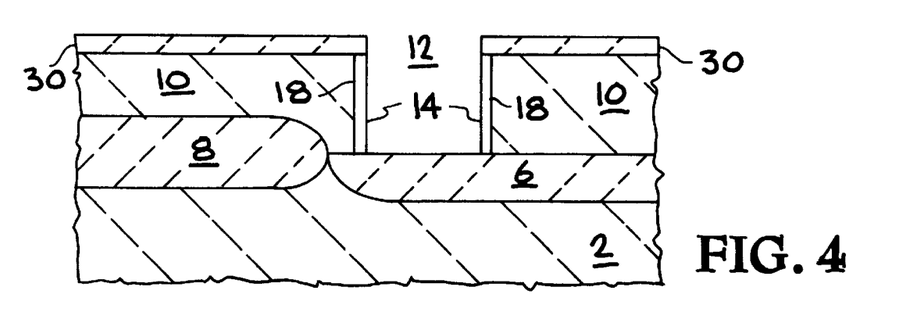
FIG. 4 is a fragmentary vertical cross-sectional view of the structure of FIG. 3 with the resist mask removed, illustrating protection of the sidewall surfaces of the contact opening in the low k carbon doped silicon oxide dielectric material, in contrast to the damage to the exposed sidewall-.surfaces of prior art FIG. 2, after the photoresist ash step.
Figure 5:
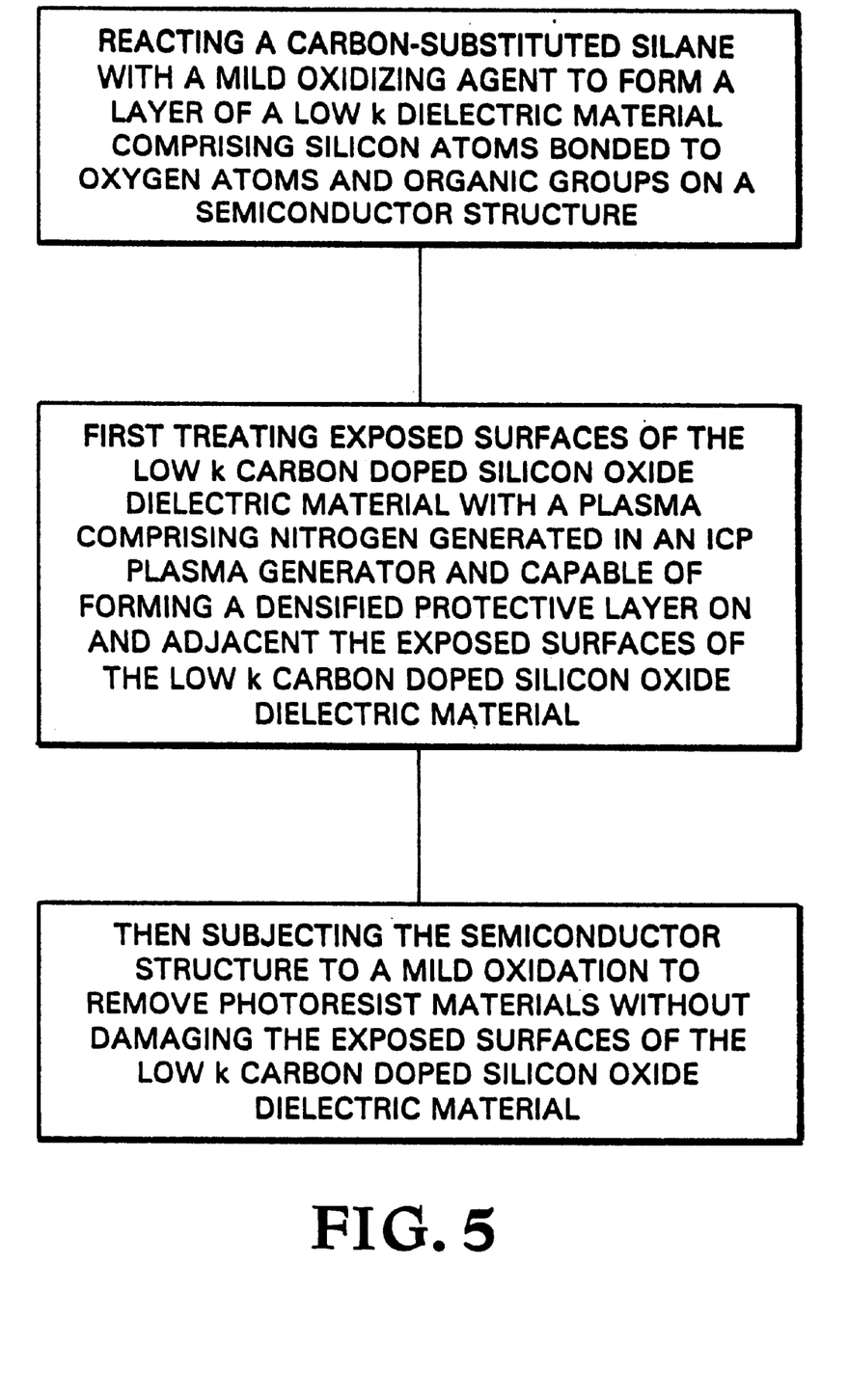
FIG. 5 is a flowsheet illustrating the process of the invention.

FIG. 4 illustrates the protection of the low k carbon doped silicon oxide dielectric material, afforded by the process of the invention, by showing the structure of FIG. 3 after subjecting the structure to the second step of the process of the invention, the mild oxidation or ashing step to remove resist mask 40. In contrast with damaged portions 16 adjacent to the surfaces of sidewalls 14 of prior art FIG. 2, densified layers 18 adjacent to the surfaces of sidewalls 14 of FIG. 4 show little or no damage.

Therefore, the method of the invention is carried out: 1) after a processing step which causes portions of the low k carbon doped silicon oxide dielectric material to have exposed surfaces, for example, after a via etch step; and 2) prior to subsequent processing steps (with respect to the exposed surfaces of the low k carbon doped silicon oxide dielectric material), for example, prior to a metal deposition step.

In accordance with the invention, the exposed surfaces of the low k carbon doped silicon oxide dielectric material on a silicon wafer, are treated, in the first step of the process of the invention, with a plasma comprising one or more of types of a plurality of atoms or molecules, for example, nitrogen or a mixture of nitrogen and oxygen. The plasma contacts exposed surfaces of the low k carbon doped silicon oxide dielectric material (e.g., exposed surfaces of the low k carbon doped silicon oxide dielectric material which make up the via walls after a via etch step), to form a thin, densified outer layer on and adjacent the exposed surfaces of the low k carbon doped silicon oxide dielectric material. This densified layer is capable of protecting the low k carbon doped silicon oxide dielectric material from degradation during the following mild oxidation step of the invention.

The following, second step of the process of the invention comprises a mild oxidizing step, in which the semiconductor wafer is exposed to a mild oxidizing reagent used to remove photoresist material from the silicon wafer. The mild oxidizing reagent used in this step will be sufficiently reactive to remove the photoresist material; without degrading the previously treated exposed surfaces of the low k carbon doped silicon oxide dielectric material on the semiconductor wafer.

While we do not wish to be bound by any theories, it appears that the replacement of the conventional silicon oxide dielectric layer with a layer of low k carbon doped silicon oxide dielectric material apparently results in replacement of some of the oxygen atoms bonded to the silicon with organic groups, i.e., the silicon atoms form bonds with the organic groups instead of with the oxygen atoms. Then, when the structure is exposed to a conventional harsh etchant system which removes the organic photoresist mask, i.e., a harsh oxidizing or ashing system, some of the bonds between the silicon atoms and the organic groups are apparently broken, thereby removing the organic groups and leaving highly reactive silicon atoms in the exposed sidewall surfaces of the openings formed in the low dielectric constant dielectric material. This, in turn, leaves such surfaces vulnerable to subsequent absorption of moisture in which hydroxyl ions bond to the highly reactive silicon atoms adjacent the exposed surfaces of the openings in the low k dielectric material.

Furthermore, these reagents may also cause damage to the physical structure of any low k carbon doped silicon oxide dielectric material which is exposed in the via walls, resulting in porous, cracked, and/or bowed insulating material in the via walls, that is, resulting in a degraded surface. The chemical and physical damage to the insulating material which forms the via walls cause the subsequent metal deposition step to be less reliable; and the presence, in porous cavities, of gases produced during metal deposition steps result in a degradation of the metal/metal nitride properties.

Thus, it appears that the first step of the process of the invention, treatment of exposed surfaces of low k carbon doped silicon oxide dielectric material with a plasma, results in the plasma forming a densified layer with the silicon atoms in the low k carbon doped silicon oxide dielectric material. The reaction will result in a transformation of an exposed surface of the low k carbon doped silicon oxide dielectric material into a thin, densified, protective layer which serves as a sufficient barrier between the low k carbon doped silicon oxide dielectric material and the mild oxidizing reagent used in the second step of the invention to inhibit the aforementioned damage to the exposed surfaces of the low k carbon doped silicon oxide dielectric material.

The second step of the invention is a mild oxidizing step which is sufficiently reactive to remove photoresist material while not degrading the low k carbon doped silicon oxide dielectric material as a result of the mild oxidizing agent apparently being barred from reacting with the low k carbon doped silicon oxide dielectric material by the thin, densified protective layer on and adjacent the low k carbon doped silicon oxide dielectric material. When these two steps are carried out in accordance with the invention, the exposed surfaces of the low k carbon doped silicon oxide dielectric material will not be damaged by the removal of the photoresist etch mask.

The low k carbon doped silicon oxide dielectric material may comprise silicon atoms bonded to oxygen atoms and silicon atoms bonded to carbon atoms (wherein any one silicon atom may be understood to be capable of being bonded to both oxygen and carbon atoms), which carbon atoms may then be bonded to one or more other atoms (usually carbon and hydrogen atoms) in forming an "organic group." In the preferred embodiment, the low k carbon doped silicon oxide dielectric material is formed by reacting carbon-substituted silane with a mild reactant which will not break the C—H bonds between the carbon atoms and the hydrogen atoms to thereby oxidize the carbon atoms. By use of the term "mild reactant" herein is meant a reactant capable of breaking Si—H bonds to form Si—O bonds, without any substantial breaking of the C—H bond between the hydrogen atoms and the carbon atoms in the organic group to oxidize the carbon.

The mild reactant preferably is hydrogen peroxide ($H_2O_2$); and the carbon-substituted silane preferably has one or more organic groups bonded to the silicon atom in substitution for one or more hydrogens of the silane molecule. Other mild reactants can be used in place of hydrogen peroxide in forming the low k carbon doped silicon oxide dielectric material, provided that they will not react sufficiently vigorously to cause the C—H bond to break in preference to the Si—H bond, and therefore will not interfere with the film forming capability of the reaction product of the reactant and the substituted silane containing the above-described organic group or groups. The resultant low k carbon doped silicon oxide dielectric material may comprise a film on a silicon substrate deposited by any method commonly known to those skilled in the art, such as by chemical vapor deposition (CVD).

The plasma used to densify the exposed surfaces of the low k dielectric material after formation of vias or contact openings through a photoresist mask may comprise ions as well as radicals, and may be generated using any reactor capable of generating and maintaining a plasma, such as a reactor with a capacitively coupled plasma (CCP) generator or with an inductively coupled plasma (ICP) generator. CCP generators such as in a Matrix Asher 1178 and LAM XL 4520 or an ICP generator such as in a 9400SE series LAM etcher may be used.

An RIE generator such as in a LAM XL 4520 Etcher may be used, however, the use of a reactor with an ICP generator, such as a Matrix Asher 1178 or a 9400SE series LAM Etcher, is preferred because of the ability of an ICP reactor to provide a high density plasma and the ability of an ICP reactor to better control the plasma flux. Process parameters such as pressure, flow rate, and power should be adjusted to provide a plasma flux that will be sufficient for the densification of the low k carbon doped silicon oxide dielectric material without causing a significant amount of sputtering of the low k carbon doped silicon oxide dielectric material, preferably a plasma flux of from about 30 to about 40 eV. Power settings for the Matrix Asher 1178 reactor using an ICP plasma generator sufficient for the densification of the low k carbon doped silicon oxide dielectric material without causing a significant amount of sputtering will typically vary from about 100 watts to about 800 watts, and preferably from about 200 watts to about 600 watts.

CCP-generated plasma may be formed in a Matrix Asher 1178 by flowing gas into a vacuum chamber which may be maintained at a pressure ranging from as high as 1000 milliTorr to as low as 10 milliTorr, with the gas flow adjusted according to both the desired pressure, as well as the size of the treatment chamber. For example, in the Matrix Asher 1178, the flow of nitrogen gas may vary from as little as 5 sccm for lower pressure conditions to as high as 300 sccm for higher pressure operating conditions. For other treatment chambers, flow ranges equivalent to such flow rates for the Matrix Asher 1178 can be derived from these ranges.

The treatment of the exposed surfaces of the low k carbon doped silicon oxide material with the plasma may be carried out at a temperature of 100° C. or lower, preferably about 25° C. or lower, and have a duration of from 10 to 200 seconds. For other chamber sizes and types, ambient temperature, and time of duration, as well as flow rates will be modified accordingly in order to be comparable to the treatment in the Matrix Asher 1178.

The atoms and molecules which may be used as source components of the plasma (which plasma comprises ions and radicals) may be selected from the group comprising oxygen, nitrogen, hydrogen, argon, neon, helium, or any other atoms or molecules which may be used in a plasma capable of forming a protective densified layer on and adjacent the exposed surfaces of the low k carbon doped silicon oxide dielectric material. It should be noted that each of these atoms or molecules may be used as the sole source of the plasma, or used in combination with one or more of the above listed source component atoms or molecules to provide a plasma with a plurality of different components. Preferably, nitrogen will be used in the formation of the plasma.

In accordance with the second step of the invention, the silicon wafer will be exposed to a mild oxidizing reagent. This mild oxidizing reagent may be defined as any reagent capable of removing photoresist material from a silicon wafer while not degrading the exposed surfaces of the low k carbon doped silicon oxide dielectric material previously subjected to the densification step of the invention. Preferably, this mild oxidizing reagent will comprise an $H_2O$ plasma. Use of a plasma comprising the mild oxidizing reagent will be effective when the plasma is effective in increasing the rate of photoresist removal by way of ion bombardment and decreasing the rate of photoresist removal by way of chemical reaction.

The method of formation of a plasma for use in the second step of the process may take place by any of a plurality of methods for plasma formation known to those of skill in the art, including, for example, capacitively coupled plasma formation, inductively coupled plasma formation, and the like. The plasma, for example a capacitively coupled plasma, may be generated in a reaction chamber such as a Matrix 1178 chamber.

Formation of the plasma in a Matrix 1178 chamber may take place at a power of about 20 W to about 2000 W, preferably from about 100 W to about 1000 W, most typically from 400 W to about 700 W. The reaction will take place at a temperature below 90° C., preferably from about 0° C. to about 50° C., most preferably from about 0° C. to about 25° C., typically about 10° C. Flow rate of the mild oxidizing reagent will be from about 10 sccm to about 500 sccm, preferably from about 20 sccm to about 200 sccm, most preferably from about 50 sccm to about 150 sccm, typically from about 55 sccm to about 75 sccm. This will take place in a pressure range of about 30 mTorr to about 1000 mTorr. The semiconductor wafer will be exposed to the plasma comprising the mild oxidizing reagent for a time range sufficient to remove the photoresist material from the silicon wafer. Preferably, the time of exposure will be from about 40 seconds to about 300 seconds for a 1 mm thick layer of photoresist, and typically about 220 seconds. Based on the thickness of the photoresist material, the time of exposure to the plasma comprising the mild oxidizing reagent may vary accordingly. The above reaction parameters apply for the Matrix 1178 reaction chamber having a volume of 50 L; and it is understood that these parameters will be modified to the equivalent values for chambers of different volume.

In addition to exposing the silicon wafer to a mild oxidizing reagent, the mild oxidizing reagent may be accompanied by a nonreactive carrier gas. The nonreactive carrier gas may comprise any compound which does not react with the mild oxidizing reagent, the photoresist material, or any portion of the silicon wafer. Typically, the nonreactive carrier gas will comprise nitrogen, argon, neon, and helium, preferably nitrogen. When used in a Matrix 1178 reaction chamber, the flow rate of the nonreactive carrier gas will be from about 5 sccm to about 1000 sccm, preferably about 10 sccm to about 400 sccm, most preferably from about 10 sccm to about 100 sccm, typically about 10 sccm to about 20 sccm.

To further illustrate the practice of the invention and its beneficial results on the subsequent filling, with metal, of openings formed in low k carbon doped silicon oxide dielectric material, six 8 inch diameter silicon wafers were each coated with a 0.3–0.6 micrometer (μm) thick layer of the same low k carbon doped silicon oxide dielectric material, while a seventh positive control wafer was coated with the same thickness of conventional silicon oxide material. The low k carbon doped silicon oxide dielectric material can be formed by combining methylsilane with hydrogen peroxide in a CVD step. A 300 nm silicon oxide capping layer was applied by CVD over the layer of low k carbon doped silicon oxide dielectric material on each of six wafers. Identical photoresist masks were then applied over the uppermost layers on the seven wafers and a plurality of vias having aspect ratios of about 2:1 were then etched through the mask into and through the respective layers of low k carbon doped silicon oxide dielectric material on each of the six wafers and through the conventional silicon oxide layer of the seventh wafer, using a conventional $Ar/C_4F_8/O_2/N_2$ plasma etchant system.

At this point, exposed surfaces of the low k carbon doped silicon oxide dielectric material, i.e., the exposed surfaces of the vias just formed, on three of the wafers were then treated with a nitrogen-CCP plasma, in accordance with the densification step of the invention, while the exposed surfaces of the layer of low k carbon doped silicon oxide dielectric material on the three of the wafers (acting as the negative controls) were not so treated. The wafers to be treated were placed in a Matrix 1178 RF chamber and 12 sccm of nitrogen was flowed through the chamber while a pressure of 300 milliTorr was maintained. A nitrogen-CCP plasma was ignited in the chamber and maintained at a power level of 500 watts. Treatment of the wafers with the plasma in the treatment chamber occurred for 2.5 minutes at a temperature of 10° C.

The three wafers treated with the nitrogen-CCP plasma were then removed from the nitrogen-CCP plasma reactor and all six wafers were then subjected to a mild oxidation step in accordance with the invention, consisting of an $N_2/H_2O$ CCP in a Matrix 1178 reaction chamber, at a power level of 550 watts, a temperature of 10° C., and a pressure of 300 milliTorr, for 3.5 minutes, wherein the $N_2$ was flowed at 20 sccm and $H_2O$ was flowed at 100 sccm. The control wafer wf19 (having the conventional oxide coating instead of low k material) was subjected to the same ashing process as described above to remove the photoresist mask therefrom.

One of the three wafers, which were not treated with the densification step of the invention prior to the mild oxidizing step of the invention (wf2), was treated with the densification step of the invention after treatment with the mild oxidizing step of the invention.

All seven wafers were then treated with a step of conventional titanium, titanium nitride, and tungsten deposition to fill the openings formed in the layer of low k carbon doped silicon oxide dielectric material on each wafer by sputtering 30 nm of titanium metal, then 45 nm of titanium nitride, and finally sputtering 300 nm of tungsten metal over the respective layers dielectric material on the seven wafers, followed by planarizing the three layers down to the level of the top surface of the respective layers of dielectric material.

Figure 6:
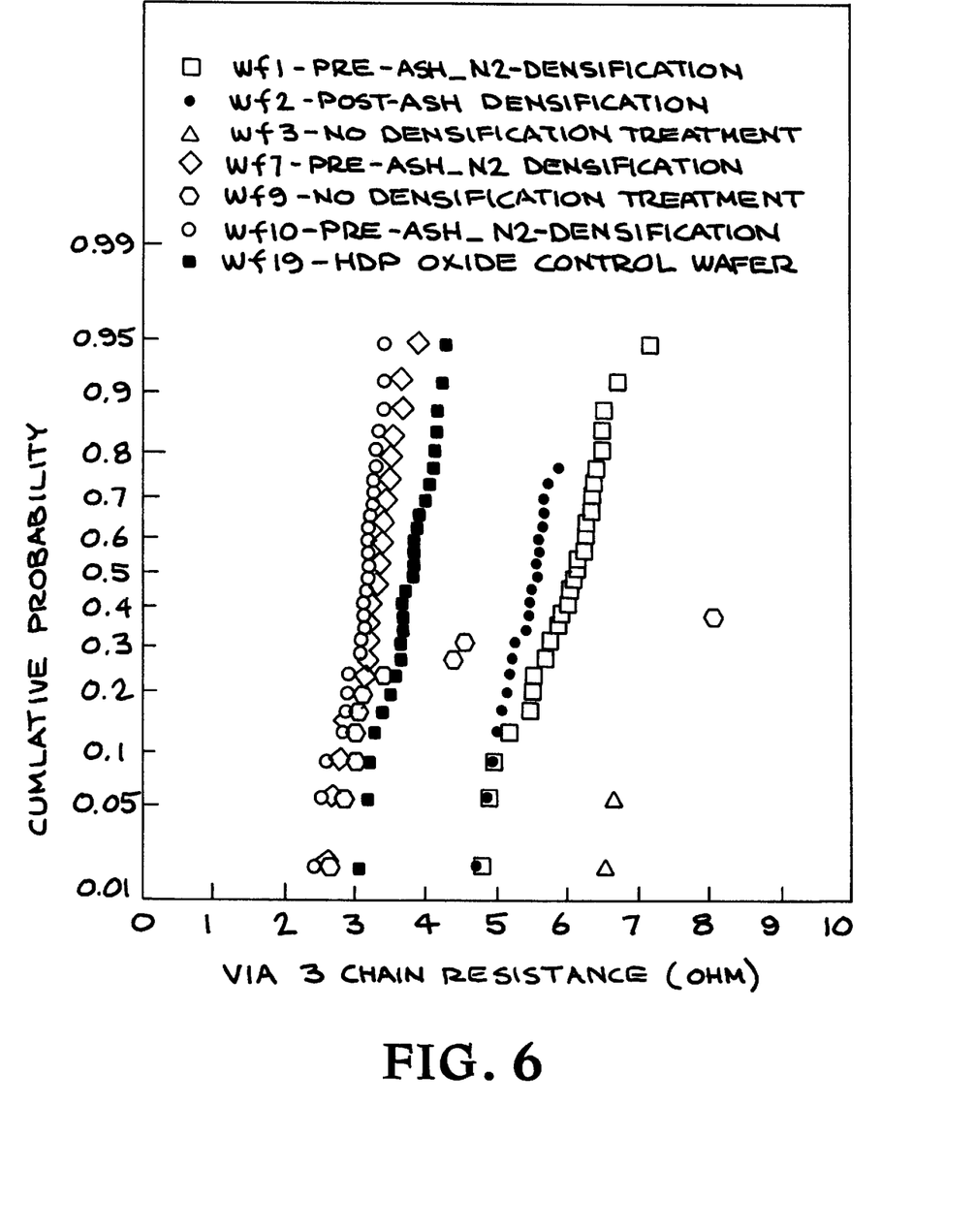
FIG. 6 is a graph showing the resistance of metal-filled vias in wafers treated in accordance with the invention versus metal filled vias in wafers not so treated.

The seven wafers were then physically examined using Fourier transform infrared spectroscopy (FTIR), electronic testing (ET), and SIMS to test for defective metal deposition vias as a result of the mild ashing and metal deposition steps. The results of the ET testing, as illustrated in the graph of FIG. 6, show the number (%) of metal-filled vias on wafers (ordinate) having a measured resistance (abscissa). Acceptable resistance is considered to be below 10 ohms, with even lower resistances being preferred. For the three wafers treated with the densification step of the invention prior to the mild oxidation step of the invention (wafers wf1, wf7, and wf10) 95% of the metal-filled vias had resistances of 7 ohms or less. In contrast, the two wafers with no predensification, wf3 and wf9, respectively showed only about 10% and 40% of the metal-filled vias having an acceptable resistance. The wafer treated with a densification step after the mild oxidation step (wf2) showed only a partial improvement, about 80% metal-filled vias had resistances of 10 ohms or less. The control wafer (wf19) with conventional (non-low k) silicon oxide dielectric material, and subjected to the same ashing conditions, showed an ET profile very similar to the three wafers treated in accordance with the invention. Thus, the wf1, wf7, and wf10 wafers treated in accordance with the invention result in a % yield of metal-filled vias with acceptable resistances comparable to the same ashing treatment of wafer (wf19) having metal-filled vias in conventional (non-low k) dielectric material thereon. The 5% yield loss shown in FIG. 6 is not related to the ash treatment, but due to other conditions in the apparatus.

It should be noted that while the invention has been particularly described with respect to the treatment of exposed surfaces of vias or contact openings in a layer of low k carbon doped silicon oxide dielectric material, the process of the invention has application in the treatment of any exposed surface of a low k carbon doped silicon oxide material, regardless of the function of or reason for the exposed surface. For example, if a protective capping layer, such as illustrated capping layer 30, is not formed over the layer of low k carbon doped silicon oxide dielectric material (between the low k carbon doped silicon oxide dielectric material and the resist mask), then this upper surface of the layer of low k carbon doped silicon oxide dielectric material would also be damaged during the removal of the resist mask, and may therefore be treated by the first step in the process of the invention prior to deposition of the resist mask in order to form a densified protective layer (similar to that of capping layer 30) over the layer of low k carbon doped silicon oxide dielectric material and subsequently treated by the second step in the process of the invention to thereby prevent degradation of the low k carbon doped silicon oxide dielectric material.

The treatment of the invention may also have application where a layer of metal interconnects is formed from a metal such as copper which does not pattern well, and the insulation layer is first deposited and patterned prior to deposition of the metal into the patterned trenches (the so-called damacene process). If the insulation layer comprises a low k carbon doped silicon oxide dielectric material, then the process of the invention could be used to treat the exposed surfaces of the layer of low k carbon doped silicon oxide dielectric material after formation of the pattern of trenches therein and prior to metal deposition step or steps. Then, prior to the metal deposition step or steps, etch residues and copper oxide residues may be removed using the etch residue removal process described in U.S. patent application Ser. No. 09/281,602 entitled PLASMA CLEANING PROCESS FOR OPENINGS FORMED IN ONE OR MORE LOW DIELECTRIC CONSTANT INSULATION LAYERS OVER COPPER METALLIZATION IN INTEGRATED CIRCUIT STRUCTURES which was filed by one of us with others on Mar. 29, 1999 and assigned to the assignee of this application, which is designed to inhibit sputtering of copper during removal of the etch residues and copper oxides from underlying copper layers.

Thus, the invention provides a treatment process which comprises a first step of forming a densified layer on and adjacent exposed surfaces of a low k carbon doped silicon oxide dielectric material, which densified layer prevents the low k carbon doped silicon oxide dielectric material from being degraded during the second step of the process of the invention. The second step of the process of the invention comprises a mild oxidizing step to remove photoresist materials from the semiconductor wafer without damaging the low k carbon doped silicon oxide dielectric material. The process of the invention will result in protection of the low k carbon doped silicon oxide dielectric material from damage during subsequent processing steps such as a metal deposition step or steps.

Having thus described the invention, what is claimed is:

1. A method for protecting exposed via sidewall surfaces of a low k carbon doped silicon oxide dielectric material on a semiconductor wafer, in order to protect said exposed surfaces of said low k carbon doped silicon oxide dielectric material from damage during removal of photoresist mask materials after etching of said low k carbon doped silicon oxide dielectric material through said photoresist mask to form said vias, which method comprises the steps of:
   (a) treating said exposed surfaces of low k carbon doped silicon oxide dielectric material with a plasma capable of forming a densified layer on and adjacent said exposed surfaces of low k carbon doped silicon oxide dielectric material to protect said exposed surfaces of low k carbon doped silicon oxide dielectric material during subsequent removal of said photoresist mask materials; and
   (b) then treating said semiconductor wafer with a mild oxidizing reagent comprising an $H_2O$ vapor plasma sufficient to remove photoresist mask materials from said semiconductor wafer;
   whereby said exposed surfaces of said low k carbon doped silicon oxide dielectric material are protected from damage during said removal of said photoresist mask materials.

2. The method of claim 1 wherein said first step of treating said exposed surfaces of said low k carbon doped silicon oxide dielectric material with said plasma further comprises treating said low k carbon doped silicon oxide dielectric material with a plasma wherein the source components of said plasma are selected from the group consisting of oxygen, nitrogen, hydrogen, argon, neon, helium, and any combination thereof.

3. The method of claim 1 wherein said first step of treating said exposed surfaces of said low k carbon doped silicon oxide dielectric material with said plasma further comprises treating said low k carbon doped silicon oxide dielectric material with a nitrogen plasma to form said densified layer on said exposed surfaces of said low k carbon doped silicon oxide dielectric material.

4. The method of claim 1 wherein said first step of treating said exposed surfaces of said low k carbon doped silicon oxide dielectric material with said plasma further comprises treating said low k carbon doped silicon oxide dielectric material with an inductively coupled plasma at a power range of from about 100 watts to about 800 watts.

5. The method of claim 1 wherein said first step of treating said exposed surfaces of said low k carbon doped silicon oxide dielectric material with said plasma further comprises treating said low k carbon doped silicon oxide dielectric material with a capacitively coupled plasma at a power range of from about 100 watts to about 800 watts.

6. The method of claim 1 wherein said first step of treating said exposed surfaces of said low k carbon doped silicon oxide dielectric material further comprises treating said low k carbon doped silicon oxide dielectric material with said plasma having an ion flux with energy sufficient to form a densified layer on and adjacent said exposed surfaces of low k carbon doped silicon oxide dielectric material without causing sputtering of said low k carbon doped silicon oxide dielectric material.

7. The method of claim 1 wherein said densified layer, formed by treating said exposed surfaces of low k carbon doped silicon oxide dielectric material with said plasma, ranges from about 5 nm to about 50 nm in thickness.

8. The method of claim 1 wherein said $H_2O$ vapor plasma in said second step comprises a capacitively coupled plasma at a power range of from about 20 watts to about 2000 watts.

9. The method of claim 1 wherein said mild oxidizing reagent in said second step comprising an $H_2O$ vapor plasma further comprises one or more additional gases selected from the group consisting of nitrogen, hydrogen, argon, neon, and helium.

10. The method of claim 1 wherein said second step of treating said semiconductor wafer with a mild oxidizing reagent is carried out at a temperature ranging from about 0° to about 50° C.

11. The method of claim 1 wherein said second step of treating said semiconductor wafer with a mild oxidizing reagent is carried for a time period ranging from about 40 seconds to about 300 seconds.

12. A method for treating exposed surfaces of a low k carbon doped silicon oxide dielectric material, on a semiconductor wafer, in order to protect said low k carbon doped silicon oxide dielectric material from damage during removal of photoresist materials which method comprises the steps of:
   (a) treating said exposed surfaces of low k carbon doped silicon oxide dielectric material with a plasma comprising nitrogen, said plasma being capable of forming a densified layer on and adjacent said exposed surfaces of low k carbon doped silicon oxide dielectric material; and
   (b) then treating said semiconductor wafer with a mild oxidizing reagent sufficient to remove photoresist materials from said semiconductor wafer;
   whereby said exposed surfaces of said low k carbon doped silicon oxide dielectric material are protected from damage by said removal of said photoresist materials.

13. The method of claim 12 wherein said first step of treating said exposed surfaces of said low k carbon doped silicon oxide dielectric material with said plasma further comprises treating said low k carbon doped silicon oxide dielectric material with a plasma wherein further source components of said plasma are selected from the group consisting of oxygen, hydrogen, argon, neon, helium, and any combination thereof.

14. The method of claim 12 wherein said first step of treating said exposed surfaces of said low k carbon doped silicon oxide dielectric material with said plasma further comprises treating said low k carbon doped silicon oxide dielectric material with an inductively coupled plasma at a power range of from about 100 watts to about 800 watts.

15. The method of claim 12 wherein said first step of treating said exposed surfaces of said low k carbon doped silicon oxide dielectric material with said plasma further comprises treating said low k carbon doped silicon oxide dielectric material with a capacitively coupled plasma at a power range of from about 100 watts to about 800 watts.

16. The method of claim 12 wherein said first step of treating said exposed surfaces of said low k carbon doped silicon oxide dielectric material further comprises treating said low k carbon doped silicon oxide dielectric material with said plasma having an ion flux with energy sufficient to form a densified layer on and adjacent said exposed surfaces of low k carbon doped silicon oxide dielectric material without causing sputtering of said low k carbon doped silicon oxide dielectric material.

17. The method of claim 12 wherein said densified layer, formed in said first step by treating said exposed surfaces of low k carbon doped silicon oxide dielectric material with said plasma, ranges from about 5 nm to about 50 nm in thickness.

18. The method of claim 12 wherein said low k carbon doped silicon oxide dielectric material comprises a low k carbon doped silicon oxide dielectric material formed by reacting a carbon-substituted silane with a mild oxidizing agent.

19. A method for protecting exposed via sidewall surfaces of a low k carbon doped silicon oxide dielectric material, on a semiconductor wafer, in order to protect said exposed surfaces of said low k carbon doped silicon oxide dielectric material from damage during removal of photoresist materials after etching of said low k carbon doped silicon oxide dielectric material through said photoresist mask to form said vias, which method comprises the steps of:

(a) treating said exposed surfaces of low k carbon doped silicon oxide dielectric material in a first step with a nitrogen plasma capable of forming a densified layer on and adjacent said exposed surfaces of low k carbon doped silicon oxide dielectric material to protect said exposed surfaces of low k carbon doped silicon oxide dielectric material during subsequent removal of said photoresist mask materials; and (b) then treating said semiconductor wafer in a second step with a mild oxidizing reagent comprising an $H_2O$ vapor plasma sufficient to remove photoresist materials from said semiconductor wafer without damaging said low k carbon doped silicon oxide dielectric material;

whereby said exposed surfaces of said low k carbon doped silicon oxide dielectric material are protected from damage during said removal of photoresist materials.

20. The method of claim 19 wherein said first step of treating said exposed surfaces of said low k carbon doped silicon oxide dielectric material with said nitrogen plasma further comprises optionally treating said low k carbon doped silicon oxide dielectric material with a further plasma source, component selected from the group consisting of oxygen, hydrogen, argon, neon, helium, and any combination thereof.

21. The method of claim 19 wherein said first step of treating said exposed surfaces of low k carbon doped silicon oxide dielectric material with said plasma having an ion flux with energy sufficient to form a densified layer on and adjacent said exposed surfaces of low k carbon doped silicon oxide dielectric material without causing sputtering of said low k carbon doped silicon oxide dielectric material.

22. The method of claim 19 wherein said densified layer, formed in said first step by treating said exposed surfaces of low k carbon doped silicon oxide dielectric material with said plasma, ranges from 5 nm to 50 nm in thickness.

23. The method of claim 19 wherein said low k carbon doped silicon oxide dielectric material comprises a low k carbon doped silicon oxide dielectric material formed by reacting a carbon-substituted silane with a mild oxidizing agent.

24. The method of claim 3 wherein said densified layer formed in said first step by treating said exposed surfaces of said low k carbon doped silicon oxide dielectric material with said nitrogen plasma further comprises treating said exposed surfaces with a nitrogen plasma wherein further source components of said plasma are selected from the group consisting of oxygen, hydrogen, argon, neon, helium, and any combination thereof.

* * * * *